(12) United States Patent
Wang et al.

(10) Patent No.: US 11,516,595 B2
(45) Date of Patent: Nov. 29, 2022

(54) INTEGRATED STRUCTURE OF MEMS MICROPHONE AND AIR PRESSURE SENSOR AND FABRICATION METHOD THEREOF

(71) Applicant: WEIFANG GOERTEK MICROELECTRONICS CO., LTD., Shandong (CN)

(72) Inventors: Dexin Wang, Shandong (CN); Huabin Fang, Shandong (CN); Qinglin Song, Shandong (CN)

(73) Assignee: WEIFANG GOERTEK MICROELECTRONICS CO., LTD., Shandong (CN)

( * ) Notice: Subject to any disclaimer, the term of this patent is extended or adjusted under 35 U.S.C. 154(b) by 158 days.

(21) Appl. No.: 17/043,349

(22) PCT Filed: Sep. 27, 2018

(86) PCT No.: PCT/CN2018/107866
§ 371 (c)(1),
(2) Date: Sep. 29, 2020

(87) PCT Pub. No.: WO2019/227805
PCT Pub. Date: Dec. 5, 2019

(65) Prior Publication Data
US 2021/0021937 A1    Jan. 21, 2021

(30) Foreign Application Priority Data
May 31, 2018   (CN) .......................... 201810549621.3

(51) Int. Cl.
*H04R 19/00* (2006.01)
*H04R 19/04* (2006.01)
(Continued)

(52) U.S. Cl.
CPC ............... *H04R 19/04* (2013.01); *B81B 7/02* (2013.01); *B81C 1/00341* (2013.01);
(Continued)

(58) Field of Classification Search
CPC .. H04R 19/04; H04R 31/00; H04R 2201/003; H04R 1/04; H04R 19/005; B81B 7/02;
(Continued)

(56) References Cited

U.S. PATENT DOCUMENTS

| 2016/0277844 A1* | 9/2016 | Kopetz | ................ H04R 19/005 |
| 2017/0230758 A1* | 8/2017 | Kuntzman | ............. H04R 19/04 |
| 2018/0050902 A1* | 2/2018 | Sun | ........................ H04R 19/04 |

* cited by examiner

*Primary Examiner* — Matthew A Eason
(74) *Attorney, Agent, or Firm* — Paratus Law Group, PLLC (57) ABSTRACT

An integrated structure of a MEMS microphone and an air pressure sensor, and a fabrication method for the integrated structure, the structure including a base substrate; a vibrating membrane, back electrode, upper electrode, and lower electrode formed on the base substrate, as well as a sacrificial layer formed between the vibrating membrane and the back electrode and between the upper electrode and the lower electrode; a first integrated circuit electrically connected to the vibrating membrane and the back electrode respectively; and a second integrated circuit electrically connected to the lower electrode and the upper electrode respectively, wherein a region of the base substrate corresponding to the vibrating membrane is provided with a back cavity; the sacrificial layer between the vibrating membrane and the back electrode is hollowed out to from a vibrating space that communicates with the exterior of the integrated structure, and the sacrificial layer between the upper electrode and the lower electrode is hollowed out to form a closed space; and the integrated circuits are formed on a chip, thereby reducing the interference of connection lines on the performance of a (Continued)

microphone, reducing the introduction of noise, reducing the size of a product and reducing power consumption.

10 Claims, 9 Drawing Sheets (51) Int. Cl.
*B81B 7/02* (2006.01)
*B81C 1/00* (2006.01)
*H04R 31/00* (2006.01)

(52) U.S. Cl.
CPC ...... *H04R 31/00* (2013.01); *B81B 2201/0257* (2013.01); *B81B 2201/0264* (2013.01); *B81B 2203/0127* (2013.01); *B81B 2203/0315* (2013.01); *B81B 2203/04* (2013.01); *B81B 2207/015* (2013.01); *B81C 2201/0109* (2013.01); *B81C 2201/0132* (2013.01); *B81C 2203/0735* (2013.01); *H04R 2201/003* (2013.01)

(58) Field of Classification Search
CPC .... B81B 2201/0257; B81B 2201/0264; B81B 2203/0127; B81B 2203/0315; B81B 2203/04; B81B 2207/015; B81C 1/00341; B81C 2201/0109; B81C 2201/0132; B81C 2203/0735; H01L 41/053
See application file for complete search history.

INTEGRATED STRUCTURE OF MEMS MICROPHONE AND AIR PRESSURE SENSOR AND FABRICATION METHOD THEREOF

CROSS REFERENCE TO PRIOR APPLICATION

This application is a National Stage Patent Application of PCT International Patent Application No. PCT/CN2018/107866 (filed on Sep. 27, 2018) under 35 U.S.C. § 371, which claims priority to Chinese Patent Application No. 201810549621.3 (filed on May 31, 2018), which are all hereby incorporated by reference in their entirety.

TECHNICAL FIELD

The present invention relates to the field of microphones. More particularly, the present invention relates to an integrated structure of a MEMS microphone and a air pressure sensor, and a fabrication method thereof.

BACKGROUND

In recent years, with the development of science and technology, the size of electronic products such as a mobile phone, a watch/a wristband, and the like has been continuously reducing, and the performance requirements of the portable electronic products are increasingly high, which requires that the size of the electronic assembly to be matched with the portable electronic products must be reduced accordingly.

Micro Electro-Mechanical Systems (MEMS) is increasingly widely used in electronic products. At present, MEMS microphones and MEMS air pressure sensors have been widely used in consumer electronic products such as mobile phones, watches/wristbands, and the like. As the user's demand for light and small consumer end products becomes higher and higher, sensors are also developing towards high performance, small size, integration, and low power consumption. Current MEMS microphones and MEMS air pressure sensors employ a system-level package, which is connected to the outside through connection lines. The number of these connection lines is large and the total length is long, as a result, the performance of the microphones is easily interfered by external signals and connection lines, which leads to noise and thus causes the signal-to-noise ratio of the MEMS microphones to improve difficultly.

SUMMARY OF THE INVENTION

One object of the present invention is to provide an integrated structure of a MEMS microphone and an air pressure sensor, in which a first integrated circuit and a second integrated circuit are integrated in a layer structure of the MEMS microphone and the MEMS air pressure sensor, thereby reducing interference of a connection line to microphone performance, reducing noise introduction, reducing product size, and reducing power consumption. Another object of the present invention is to provide a method of fabricating a MEMS microphone and a MEMS air pressure sensor.

To achieve the above objects, the present invention adopts the following technical solutions:

One aspect of the present invention discloses an integrated structure of a MEMS microphone and an air pressure sensor, comprising:

a base substrate;

a vibrating membrane, a back electrode, an upper electrode, a lower electrode formed on the base substrate, and a sacrificial layer formed between the vibrating membrane and the back electrode and between the upper electrode and the lower electrode;

a first integrated circuit electrically connected to the vibrating membrane and the back electrode, respectively; and a second integrated circuit electrically connected to the lower electrode and the upper electrode, respectively;

wherein a back cavity is formed in a region of the base substrate corresponding to the vibrating membrane, the sacrificial layer between the vibrating membrane and the back electrode is hollowed out to form a vibration space which is in communication with the exterior of the integrated structure, and the sacrificial layer between the upper electrode and the lower electrode is hollowed out to form a closed space.

Preferably, the first integrated circuit and the second integrated circuit are disposed on the base substrate, a first metal layer is formed on the first integrated circuit, and a second metal layer is formed on the second integrated circuit;

a first lead-out electrode electrically connected to the first metal layer through a first via and a second lead-out electrode electrically connected to the second metal layer through a second via are further formed on the sacrificial layer;

the first lead-out electrode is further connected to the back electrode, and the second lead-out electrode is further connected to the upper electrode.

Preferably, a third metal layer is formed on the vibrating membrane, and a fourth metal layer is formed on the lower electrode, the third metal layer is connected to the first metal layer through a first metal trace formed on the base substrate, and the fourth metal layer is connected to the second metal layer through a second metal trace formed on the base substrate; alternatively a third lead-out electrode electrically connected to the third metal layer through a third via and a fourth lead-out electrode electrically connected to the fourth metal layer through a fourth via are formed on the sacrificial layer, the third lead-out electrode is electrically connected to the first lead-out electrode and the fourth lead-out electrode is electrically connected to the second lead-out electrode.

Preferably, a passivation layer is further formed on the first lead-out electrode and the second lead-out electrode; at least portions of the first lead-out electrode and the second lead-out electrode are exposed through the passivation layer.

Preferably, an insulating layer is further formed between the sacrificial layer and the upper electrode and between the sacrificial layer and the back electrode, and third through holes for communicating the vibration space with the exterior of the integrated structure is formed in a region of the insulating layer corresponding to the vibration space.

The other aspect of the present application discloses a method of fabricating an integrated structure of a MEMS microphone and an air pressure sensor, comprising:

forming a vibrating membrane, a lower electrode, a first integrated circuit, and a second integrated circuit on a base substrate by a patterning process;

forming a sacrificial layer;

forming an upper electrode and a back electrode on the sacrificial layer by a patterning process;

wherein the first integrated circuit is electrically connected to the vibrating membrane and the back electrode, respectively, and the second integrated circuit is electrically connected to the lower electrode and the upper electrode, respectively;

etching the sacrificial layer between the upper electrode and the lower electrode and sealing to form a closed space;

etching the sacrificial layer between the vibrating membrane and the back electrode to form a vibration space which is communicated with the exterior of the integrated structure; and etching a region of the base substrate corresponding to the vibrating membrane to form a back cavity.

Preferably, the method further comprises:

prior to depositing the sacrificial layer, depositing a metal on the first integrated circuit and the second integrated circuit and patterning the metal to form a first metal layer and a second metal layer;

after depositing the sacrificial layer, further forming a first via and a second via on the sacrificial layer and metallizing the first via and the second via so as to be connected to the first metal layer and the second metal layer, respectively;

depositing a metal on the upper surface of the sacrificial layer and patterning the metal to form a first lead-out electrode connected to the first via and a second lead-out electrode connected to the second via, while connecting the first lead-out electrode and the back electrode and connecting the second lead-out electrode and the upper electrode by the patterning.

Preferably, the method further comprises:

prior to depositing the sacrificial layer, depositing a metal on the vibrating membrane and patterning the metal to form a third metal layer, and depositing a metal on the lower electrode and patterning the metal to form a fourth metal layer, forming a first metal trace connecting the third metal layer and the first metal layer on the base substrate, and forming a second metal trace connecting the fourth metal layer and the second metal layer on the substrate; Alternatively forming a third via and a fourth via on the sacrificial layer and metallizing the third via and the fourth via so as to be electrically connected to the third metal layer and the fourth metal layer, respectively, and further forming a third lead-out electrode connected to the third via and a fourth lead-out electrode connected to the fourth via on the upper surface of the sacrificial layer.

Preferably, the method further comprises forming a passivation layer on the first lead-out electrode and the second lead-out electrode; and etching the passivation layer so that at least portions of the first lead-out electrode and the second lead-out electrode are exposed through the passivation layer.

Preferably, the etching the sacrificial layer between the upper electrode and the lower electrode and sealing to form a closed space specifically comprises:

etching the upper electrode to form at least one second through hole communicated with the sacrificial layer, etching the sacrificial layer exposed and sealing the second through hole to form the closed space.

Advantageous Effects of the Present Invention

The integrated structure of a MEMS microphone and an air pressure sensor according to the present application integrates a first integrated circuit connected to the MEMS microphone and a second integrated circuit connected to the MEMS air pressure sensor on a chip of the MEMS microphone and the air pressure sensor, so that the MEMS microphone and the air pressure sensor are highly integrated, the size of the product becomes smaller, the connecting lines between the microphone and the air pressure sensor and the external circuit becomes smaller and shorter, the microphone is not easily interfered with by an external signal, and power consumption is reduced while improving the performance of the microphone and the air pressure sensor.

BRIEF DESCRIPTION OF THE DRAWINGS

The preferred embodiments of the present invention will now be described in further detail with reference to the accompanying drawings.

FIGS. 4a-13a illustrate a flow chart of the fabrication of the microphone and the first integrated circuit of FIG. 2a;

FIGS. 4b-14b illustrate a flow chart of the fabrication of the air pressure sensor and the second integrated circuit of FIG. 2b;

REFERENCE SIGNS 100. a base substrate; 101. a back cavity; 200. a vibrating membrane; 201. a vibrating membrane through hole; 202. a lower electrode; 300. a first integrated circuit; 301. a second integrated circuit; 401. a first metal layer; 402. a second metal layer; 403. a third metal layer; 404. a fourth metal layer; 405. a first metal trace; 406, a second metal trace; 500. a sacrificial layer; 501. a first via; 502. a second via; 503. a third via; 504. a fourth via; 505. a vibration space; 506. a closed space; 600. an insulating layer; 601. a third through hole; 700. an upper electrode; 800. a back electrode; 801. a first lead-out electrode; 802. a second lead-out electrode; 803. a third lead-out electrode; 804. a fourth lead-out electrode; 805. a first through hole; 900. a passivation layer; 901. a second through hole.

DETAILED DESCRIPTION

In order to more clearly describe the present invention, the present invention will be further described with reference to the preferred embodiments and the accompanying drawings. Similar parts in the drawings are denoted by the similar reference numerals. It shall be understood by those skilled in the art that the following detailed description is illustrative and not limited, and should not be taken to limit the scope of the invention.

Figure 1:
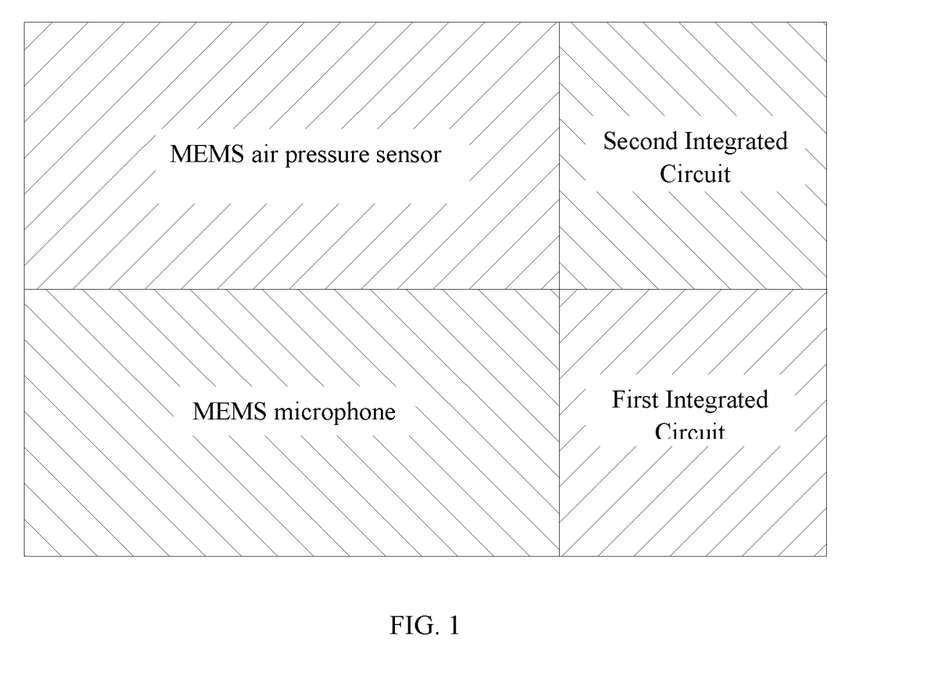
FIG. 1 illustrates a top view of an embodiment of an integrated structure of a MEMS microphone and an air pressure sensor according to the present invention.

FIG. 1 illustrates a top view of an integrated structure of a MEMS microphone and an air pressure sensor according to an embodiment of the present invention. As shown in FIG. 1, the integrated structure of the present invention is divided into a MEMS region for arranging a MEMS microphone and a MEMS air pressure sensor, and an ASIC region for arranging an integrated circuit for the MEMS microphone and the MEMS air pressure sensor. The ASIC region includes a first integrated circuit 300 region and a second integrated circuit 301 region for arranging a first integrated circuit 300 and a second integrated circuit 301, respectively. The MEMS microphone and the MEMS air pressure sensor may be electrically connected to the first integrated circuit 300 and the second integrated circuit 301 in the integrated structure. The MEMS microphone, the MEMS air pressure sensor, the first integrated circuit 300 and the second integrated circuit 301 may be arranged in other layouts and are not limited to the layout in the present embodiment.

According to the present invention, the connecting circuit for the microphone and the air pressure sensor are integrated together with the microphone and the air pressure sensor on a chip. As a result, an electrical connection is realized in a chip and the total length and the number of connecting lines are reduced, so that the influence of external signals on the microphone and the air pressure sensor is reduced, the introduced noise is reduced accordingly and power consumption is reduced. Furthermore, the present invention integrates the connecting circuit with the microphone and the sensor on one chip, thus the integration reduces the size of the product and adapts to the miniaturization development of the product. Meanwhile, the microphone, the air pressure sensor, the first integrated circuit 300, and the second integrated circuit 301 are arranged in separate sub-regions so that it facilitates isolation and shielding and the first integrated circuit 300 and the second integrated circuit 301 are formed separately from each other by surrounding and shielding respective integrated circuit by an analog ground, thereby reducing electromagnetic interference of the air pressure sensor to the microphone and reducing noise introduction. The arranging positions of the above components can be interchangeable.

Figure 2A:
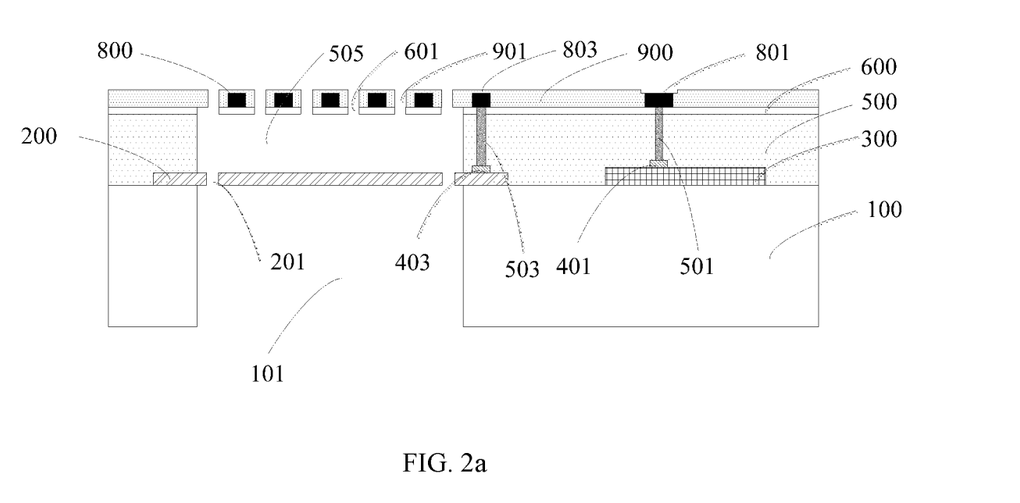
FIG. 2a illustrates a cross-sectional view of a microphone and a first integrated circuit in one embodiment of an integrated structure of a MEMS microphone and an air pressure sensor according to the present invention.
Figure 2B:
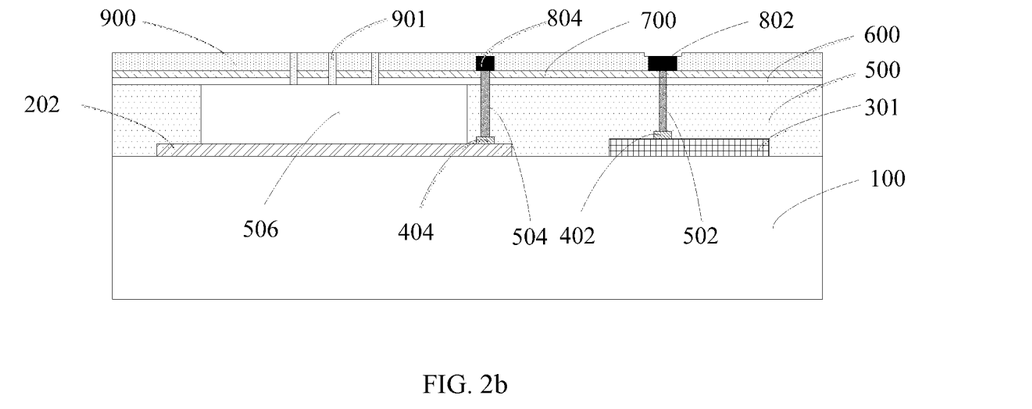
FIG. 2b illustrates a cross-sectional view of an air pressure sensor and a second integrated circuit in one embodiment of an integrated structure of a MEMS microphone and an air pressure sensor according to the present invention.

FIG. 2a illustrates a cross-sectional view of a microphone and a first integrated circuit 300 in one embodiment of an integrated structure of a MEMS microphone and an air pressure sensor according to the present invention; FIG. 2b illustrates a cross-sectional view of an air pressure sensor and a second integrated circuit 301 in one embodiment of an integrated structure of a MEMS microphone and an air pressure sensor according to the present invention. As shown in FIGS. 2a and 2b, in the present embodiment, an integrated structure of a MEMS microphone and an air pressure sensor includes a base substrate 100 and a microphone and an air pressure sensor formed on the base substrate 100. The integrated structure further comprises a first integrated circuit 300 electrically connected to the microphone and a second integrated circuit 301 electrically connected to the air pressure sensor. Specifically, the vibrating membrane 200 and the back electrode 800 are respectively electrically connected to the first integrated circuit 300, and the lower electrode 202 and the upper electrode 700 are respectively electrically connected to the second integrated circuit 301.

In the present embodiment, the microphone is a capacitive microphone and includes a vibrating membrane 200 and a back electrode 800 formed on the base substrate 100, and a sacrificial layer 500 formed between the vibrating membrane 200 and the back electrode 800. The arrangement of the sacrificial layer 500 separates the vibrating membrane 200 and the back electrode plate from each other at a certain distance. A back cavity 101 is formed in a region of the base substrate 100 corresponding to the vibrating membrane 200, and the sacrificial layer 500 between the vibrating membrane 200 and the back electrode 800 is hollowed out to form a vibration space 505 which is in communication with the exterior of the integrated structure, that is to say, the vibration space 505 is in communication with the exterior of the microphone, so that an external airflow can enter the vibration space 505 to vibrate the vibrating membrane 200. Since there is a distance between the vibrating membrane 200 and the back electrode 800, a capacitor is formed on condition that the vibrating membrane 200 and the back electrode 800 are energized. The vibrating membrane 200 and the back electrode 800 are electronically connected to the first integrated circuit 300, respectively, the vibration of the vibrating membrane 200 would cause the change of the capacitance value of the capacitor, thereby changing the voltage of the vibrating membrane 200 and the back electrode plate and generating an acoustic signal output.

In an alternative embodiment, a plurality of first through holes 805 may be formed on the back electrode 800 to communicate the vibration space 505 with the exterior of the integrated structure so that an external airflow may enter the vibration space 505 through the first through holes 805 to induce vibration of the vibrating membrane 200. Further, a passivation layer 900 may be formed on the back electrode 800, and the passivation layer 900 covers the back electrode. To ensure communication of the vibration space 505 with the exterior, a plurality of second through holes 901 may be formed on the passivation layer 900, and the second through holes 901 may be formed in the first through holes 805 of the back electrode 800.

In an alternative embodiment, for purpose of better insulation, an insulating layer 600 may be formed between the sacrificial layer 500 and the back electrode 800 and the upper electrode 700, and third through holes 601 are formed in the insulating layer 600 and correspond to the position of the second through holes 901 of the passivation layer 900. The third through holes 601 penetrate through the insulating layer 600 and communicate the second through holes 901 and the vibration space 505, resulting in the communication between the vibration space 505 and the exterior of the microphone. Preferably, the insulating layer 600 may be formed by silicon dioxide.

In an alternative embodiment, a plurality of vibrating membrane through holes 201 may be formed in the vibrating membrane 200 and penetrate through the vibrating membrane 200, so as to equalize the air flow in the microphone's vibration space 505 and the back cavity 101.

For a person skilled in the art, the capacitor structure of the microphone according to the present invention may be in such a form that the vibrating membrane 200 of the present embodiment is on the bottom and the back electrode 800 is on the top, and vice versa, which is not limited by the present invention.

The air pressure sensor includes an upper electrode 700 and an lower electrode 202 formed on the base substrate 100, and the sacrificial layer 500 formed between the upper electrode 700 and the lower electrode 202. Such arrangement of the sacrificial layer 500 enables the certain distance between the upper electrode 700 and the lower electrode 202. Wherein the sacrificial layer 500 between the upper electrode 700 and the lower electrode 202 is hollowed out to form a closed space 506. The upper electrode 700 and the lower electrode 202 are electrically connected to the second integrated circuit 301, respectively. When the air pressure sensor is subjected to an external pressure, the upper electrode 700 is deformed, so that the distance between the upper electrode 700 and the lower electrode 202 is changed, and finally the changed electrical signal is output.

As a preferred embodiment, in the present embodiment, the first integrated circuit 300 and the second integrated circuit 301 are disposed on the base substrate 100. A first metal layer 401 may be formed on the first integrated circuit 300, a second metal layer 402 may be formed on the second integrated circuit 301, a metalized first via 501 and second via 502 may be further formed in the sacrificial layer 500 and the insulating layer 600, then a first lead-out electrode 801 is formed on the sacrificial layer 500 and electrically connected to the first metal layer 401 through the first via 501, and a second lead-out electrode 802 is formed on the sacrificial layer 500 and electrically connected to the second metal layer 402 through the second via 502. Further, the first lead-out electrodes 801 may be electrically connected to the back electrode 800 and the second lead-out electrode 802 may be connected to the upper electrode 700, thereby realizing the electrical connection of the back electrode 800 to the first integrated circuit 300 and the electrical connection of the upper electrode 700 to the second integrated circuit 301. Wherein, the second lead-out electrode 802 and the upper electrode 700 are directly connected in contact, and the electrical connection of the first lead-out electrode 801 and the back electrode 800 can be realized through a metal trace formed on the insulating layer 600, which is not shown in the cross-sectional view.

Further, in the present embodiment, a third metal layer 403 may be formed on the vibrating membrane 200, a fourth metal layer 404 may be formed on the lower electrode 202, and a metallized third via 503 and a fourth via 504 may be further formed in the sacrificial layer 500. Then, a third lead-out electrode 803 is formed on the sacrificial layer 500 and the insulating layer 600 and electrically connected to the third metal layer 403 through the third via 503, and a fourth lead-out electrode 804 is formed on the sacrificial layer 500 and the insulating layer 600 and electrically connected to the fourth metal layer 404 through the fourth via 504. The third lead-out electrode 803 may be further electrically connected to the first lead-out electrode 801, and the fourth lead-out electrode 804 is connected to the second lead-out electrode 802, thereby realizing the electrical connection of the vibrating membrane 200 to the first integrated circuit 300 and the electrical connection of the lower electrode 202 to the second integrated circuit 301.

Figure 3A:
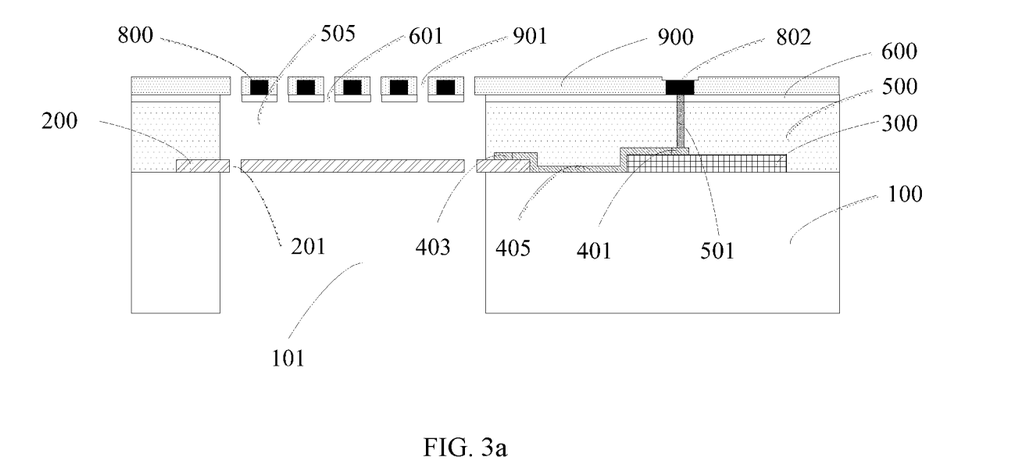
FIG. 3a illustrates a cross-sectional view of a microphone and a first integrated circuit in another embodiment of an integrated structure of a MEMS microphone and an air pressure sensor according to the present invention.
Figure 3B:
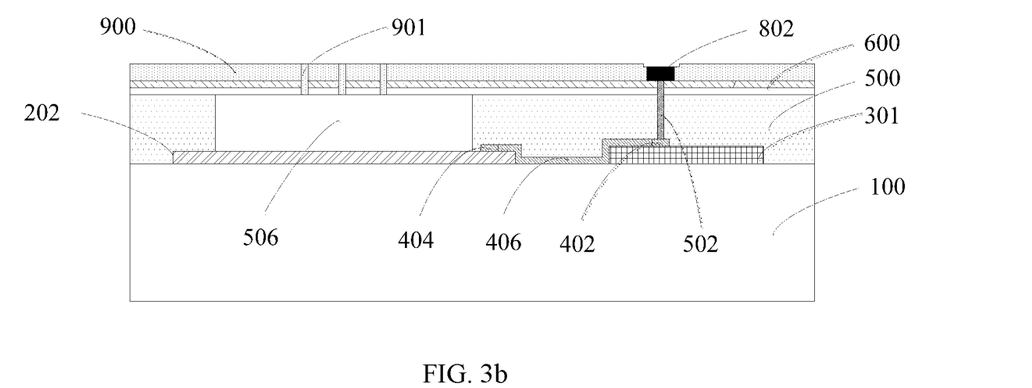
FIG. 3b illustrates a cross-sectional view of an air pressure sensor and a second integrated circuit in another embodiment of an integrated structure of a MEMS microphone and an air pressure sensor according to the present invention.

In other embodiments, as shown in FIGS. 3a and 3b, on the base substrate 100 may be also formed a first metal trace 405 electrically connecting the third metal layer 403 and the first metal layer 401 and a second metal trace 406 electrically connecting the fourth metal layer 404 and the second metal layer 402, and thus the electrical connection of the vibrating membrane 200 to the first integrated circuit 300 and the electrical connection of the lower electrode 202 to the second integrated circuit 301 may also be realized.

In this embodiment, the vibrating membrane 200 and the lower electrode 202 may be disposed in the same layer; the back electrode 800, the upper electrode 700, the first lead-out electrode 801, the second lead-out electrode 802, the third lead-out electrode 803, and the fourth lead-out electrode 804 may be disposed in the same layer; and the first metal layer 401, the second metal layer 402, the third metal layer 403, and the fourth metal layer 404 may be disposed in the same layer, which may be realized by a one-time patterning process, thereby saving process steps, reducing costs, and improving production efficiency.

Figure 4A:
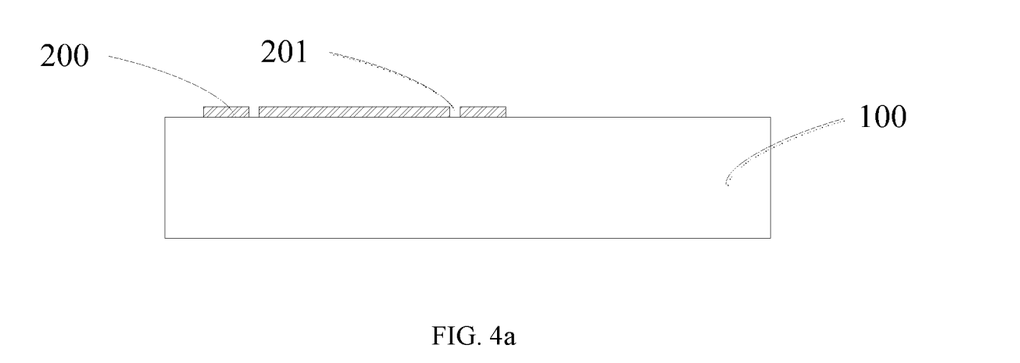
Figure 4B:
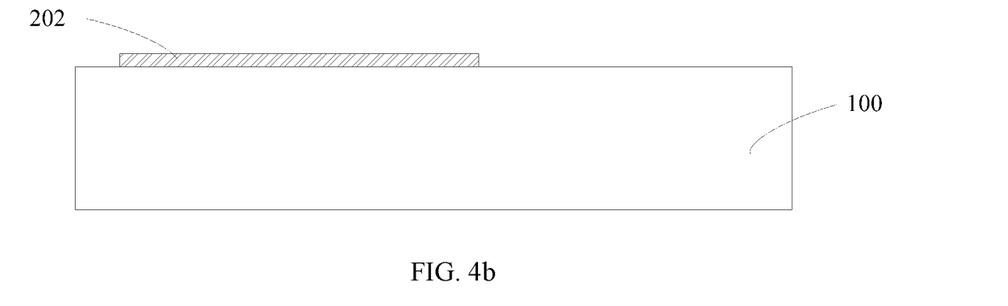

The present embodiment further provides a method for fabricating an integrated structure of a MEMS microphone and an air pressure sensor, comprising the steps of:

S101: A vibrating membrane 200 and a lower electrode 202 are formed on a base substrate 100 by a patterning process. Wherein the base substrate 100 may be made of a single crystal silicon material, and the vibrating membrane 200 and the lower electrode 202 may be made of a polysilicon material.

As shown in FIGS. 4a and 4b, the first polysilicon layer is deposited on the base substrate 100 and patterned to form the vibrating membrane 200 and the lower electrode 202. The vibrating membrane 200 and the lower electrode 202 are formed in the same layer and can be formed by a one-time patterning process, thereby saving process steps.

Specifically, polysilicon may be deposited on the base substrate 100 by low pressure chemical vapor deposition (LPCVD), and then exposure, development, etching, and stripping process are successively performed to form the vibrating membrane 200 and the lower electrode 202. A via may be formed on the vibrating membrane 200 to penetrate through the vibrating membrane 200 while vibrating membrane 200 is patterned. Wherein etching process may employ etching methods such as Deep Reactive Ion Etching (DRIE) or ion beam assisted radical etching (ICP).

In the present embodiment, deposition method may utilize a chemical vapor deposition method as used in the present embodiment, however, a physical vapor deposition method or a laser pulse deposition method may also be used, which is not limited in the present invention.

Figure 5A:
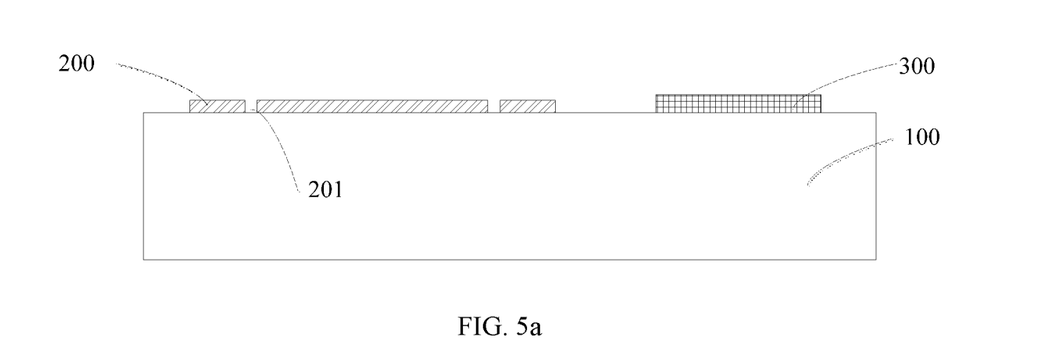
Figure 5B:
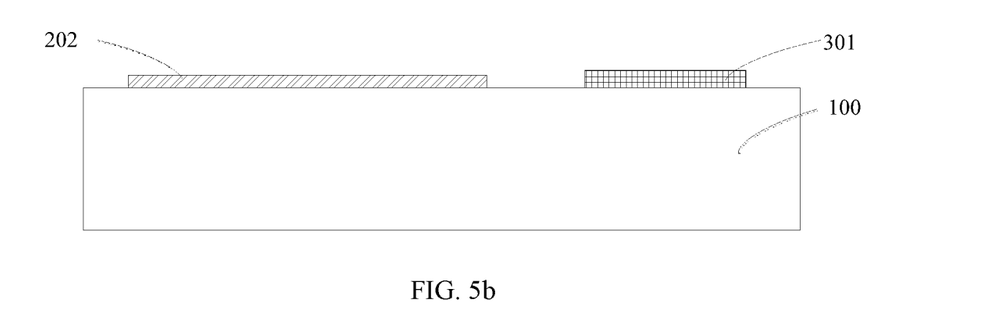

S102: A first integrated circuit 300 and a second integrated circuit 301 are formed on the base substrate 100, as shown in FIGS. 5a and 5b.

The first integrated circuit 300 and the second integrated circuit 301 may be formed in the integrated circuit ASIC region by a standard CMOS process. The CMOS process flow for forming the first integrated circuit 300 and the second integrated circuit 301 is the prior art, and details thereof are not described herein.

Figure 6A:
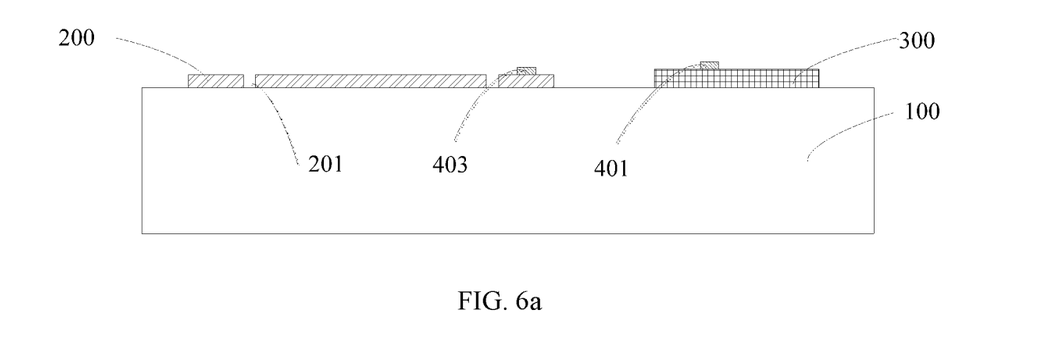
Figure 6B:
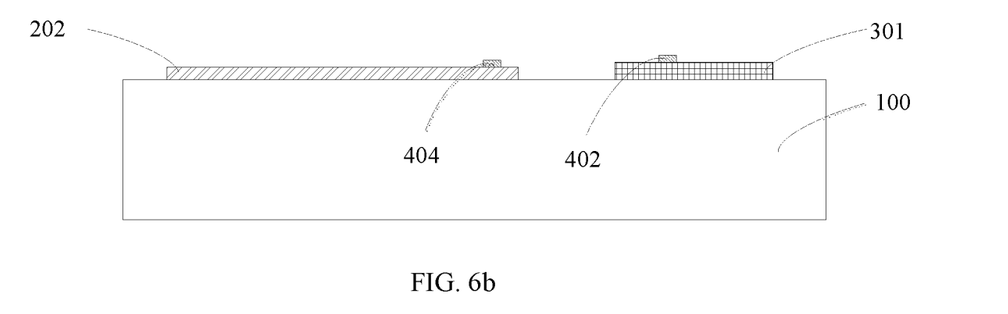

S103: A metal is deposited on the first integrated circuit 300 and the second integrated circuit 301 and patterned to form a first metal layer 401, a second metal layer 402, a third metal layer 403, and a fourth metal layer 404, as shown in FIGS. 6a and 6b.

The metal may be deposited on the base substrate 100, and exposure, development, etching, and stripping processes are successively performed to form the first metal layer 401, the second metal layer 402, the third metal layer 403, and the fourth metal layer 404. The first metal layer 401 and the second metal layer 402 are electrically connected to the first integrated circuit 300 and the second integrated circuit 301, respectively. As lead-out electrodes of the first integrated circuit 300 and the second integrated circuit 301, the first integrated circuit 300 and the second integrated circuit 301 can be electrically connected to the microphone and the air pressure sensor through the first metal layer 401 and the second metal layer 402, respectively. The third metal layer 403 and the fourth metal layer 404 serve as lead-out electrodes of the vibrating membrane 200 and the lower electrode 202, respectively, for electrical connection with an external integrated circuit.

Figure 7A:
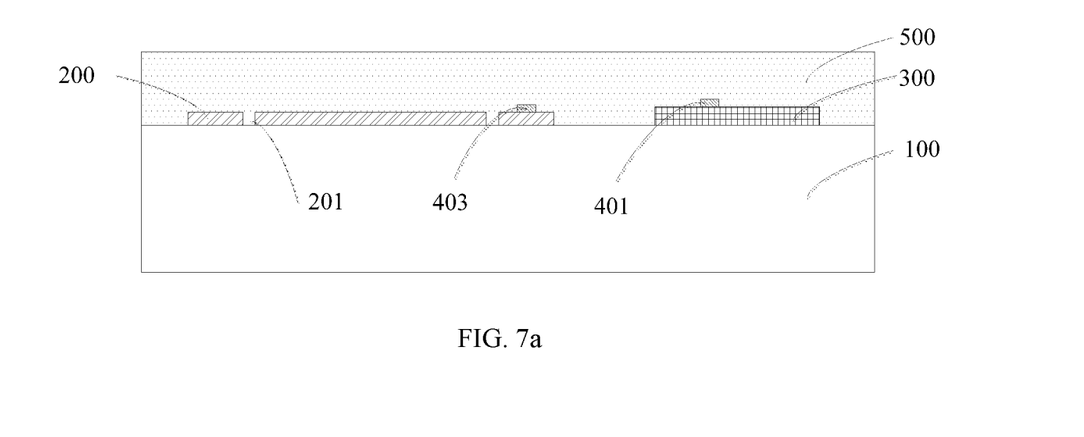
Figure 7B:
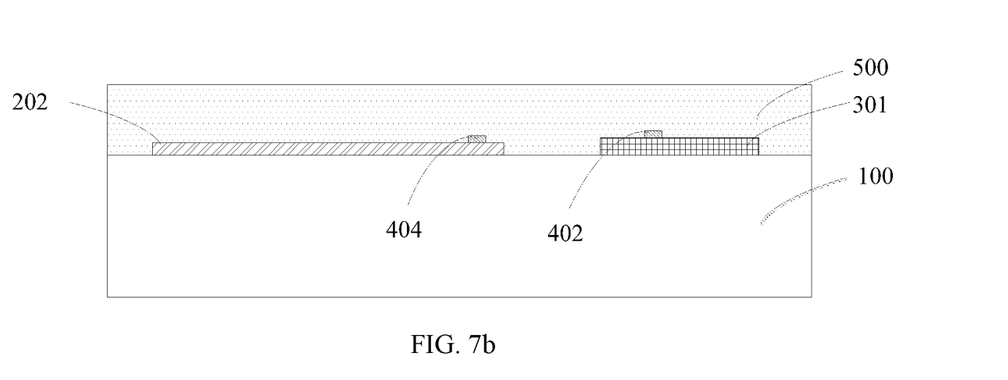

S104: A sacrificial layer 500 is deposited as shown in FIGS. 7a and 7b. The sacrificial layer 500 is deposited on the vibrating membrane 200, the lower electrode 202, the first integrated circuit 300, the second integrated circuit 301, the first metal layer 401, and the second metal layer 402. The sacrificial layer 500 is preferably formed of silicon dioxide ($SiO_2$).

Figure 8A:
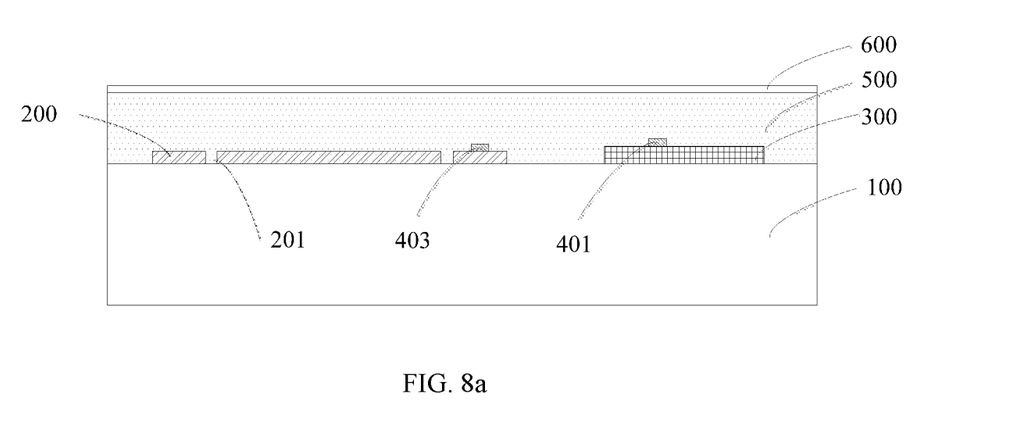
Figure 8B:
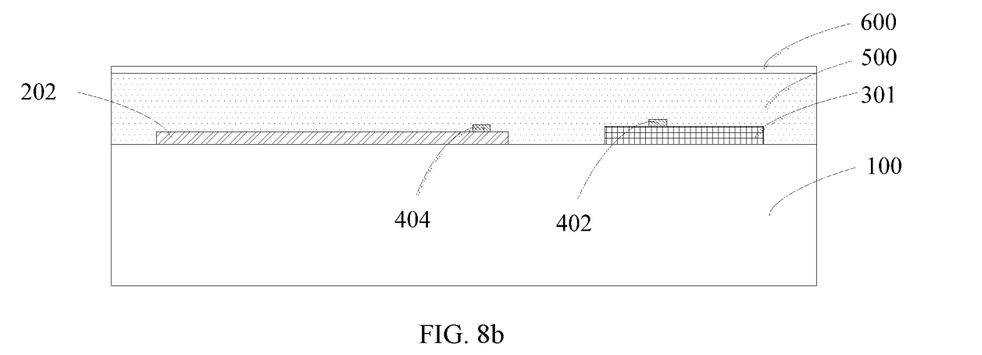

S105: An insulating layer 600 is deposited on the sacrificial layer 500, as shown in FIGS. 8a and 8b. The insulating layer 600 is preferably formed of silicon nitride (SiN).

Figure 9A:
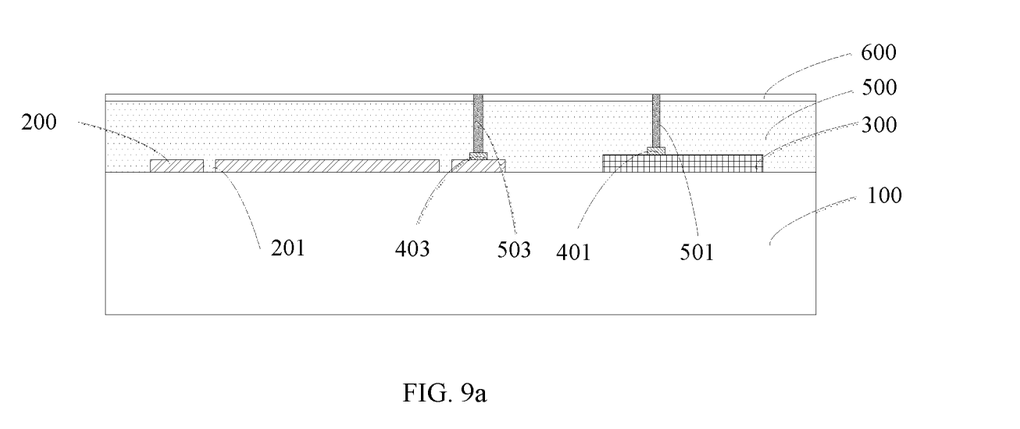
Figure 9B:
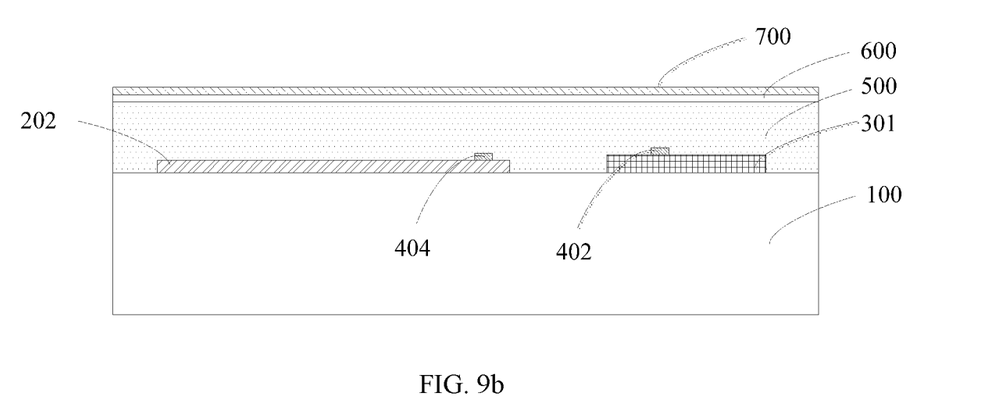

S106: A second polysilicon layer is deposited on the insulating layer 600 and the second polysilicon layer is patterned to form an upper electrode 700, as shown in FIG. 9b.

Figure 10A:
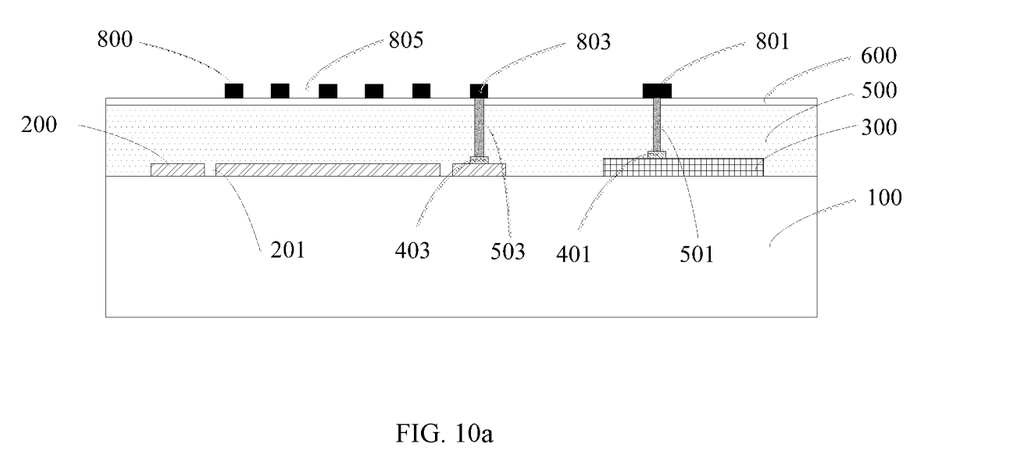
Figure 10B:
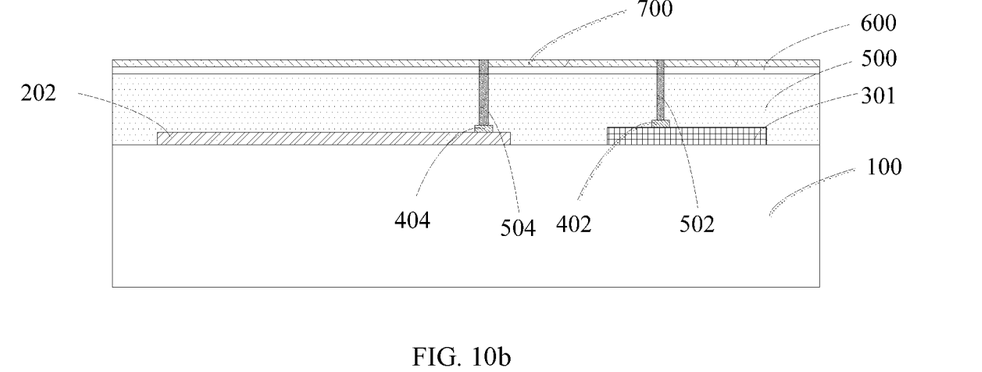

S107: A first via 501 and a third via 503 are formed on the sacrificial layer 500 and the insulating layer 600, a second via 502 and a fourth via 504 are formed on the sacrificial layer 500, the insulating layer 600 and the upper electrode 700, and the first to fourth vias 501-504 are metallized, respectively, as shown in FIG. 9a and FIG. 10b. The first to fourth vias 501-504 are in contact with the first to fourth metal layers 401-404, respectively, for purpose of electrical connection.

Figure 11A:
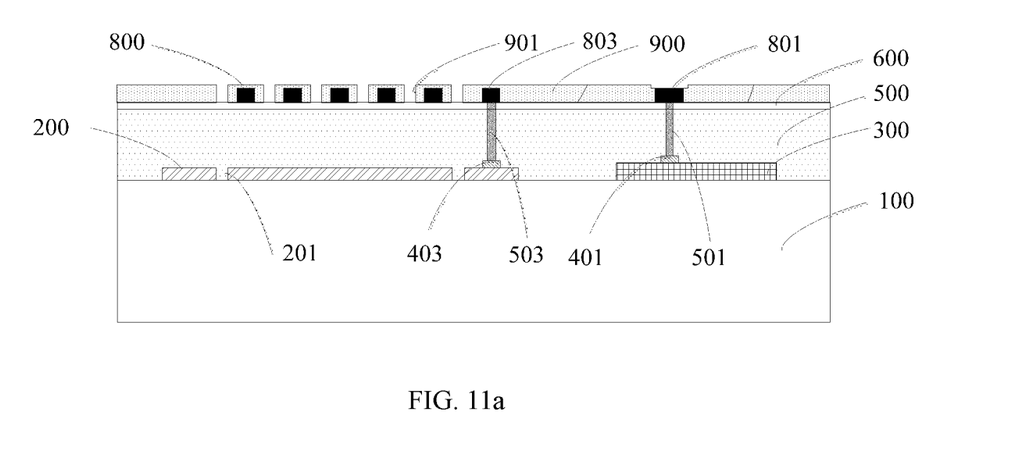
Figure 11B:
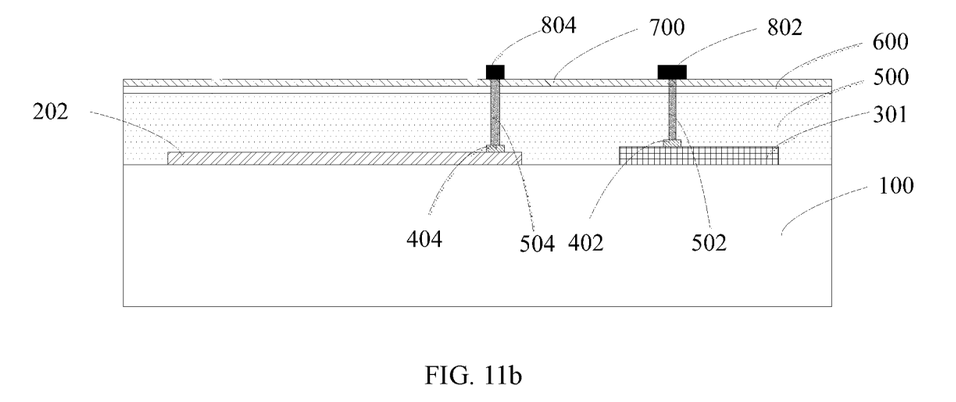

S108: A back electrode 800, a first lead-out electrode 801, a second lead-out electrode 802, a third lead-out electrode 803, and a fourth lead-out electrode 804 are formed on the sacrificial layer 500, as shown in FIGS. 10a and 11b. The back electrode 800 corresponds to the vibrating membrane 200 and forms a capacitance structure with the vibrating membrane 200. The first to fourth lead-out electrodes 801-804 are electrically connected to the first to fourth vias 501-504, respectively, and the first lead-out electrode 801 is connected to the third lead-out electrode 803 and the back electrode 800 by metal traces, and the second lead-out electrode 802 is connected to the fourth lead-out electrode 804 and the upper electrode 700 by metal traces, wherein the metal traces are formed at the same time in this step and not shown in the figure. At the same time, at least one first through hole(s) 805 is formed in the back electrode 800 for enabling the microphone vibration system to be in communication with the exterior of the microphone so that the outside air flow can enter into the vibration space 505.

Figure 12A:
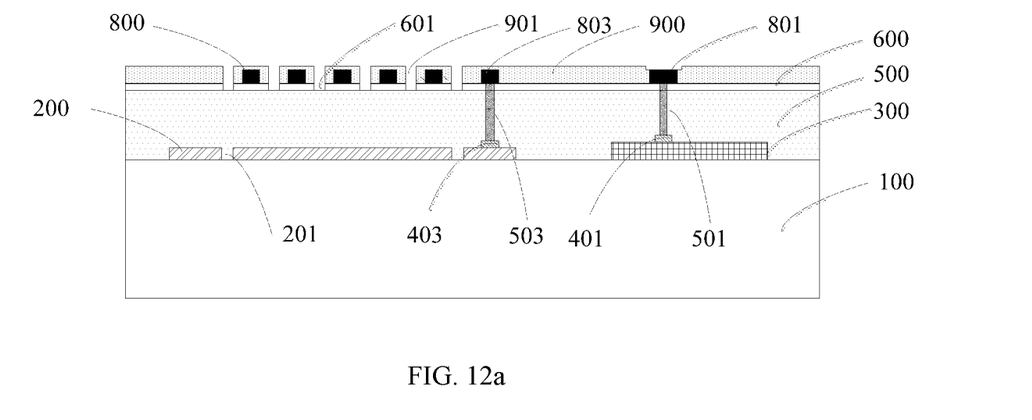
Figure 12B:
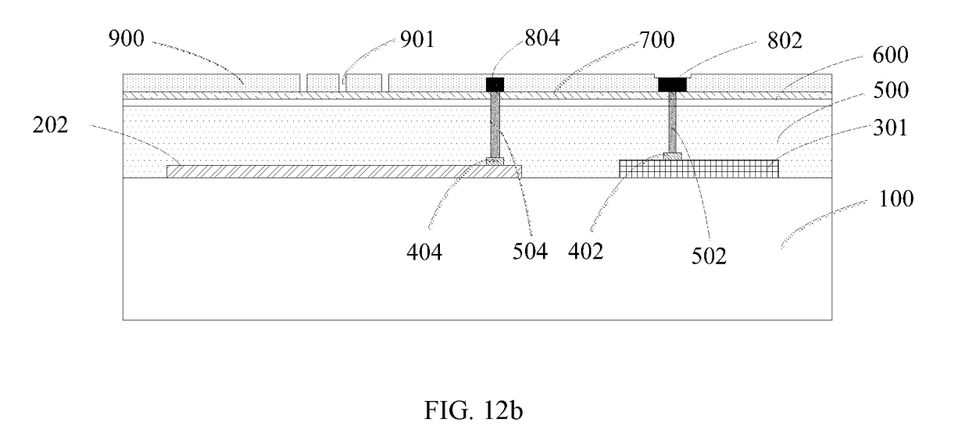

S109: A passivation layer 900 is formed on the layer structure formed in step S108, and a plurality of second through holes 901 are formed on the passivation layer 900 by etching the portion of the passivation layer in the at least one first through hole(s) 805 in the back electrode 800 down to the insulating layer 600 and by etching a portion of the passivation layer on the upper electrode down to the insulating layer 600, as shown in FIGS. 11a and 12b. Preferably, the passivation layer 900 may be formed by deposition of SiN using Plasma Enhanced Chemical Vapor Deposition (PECVD).

Figure 13A:
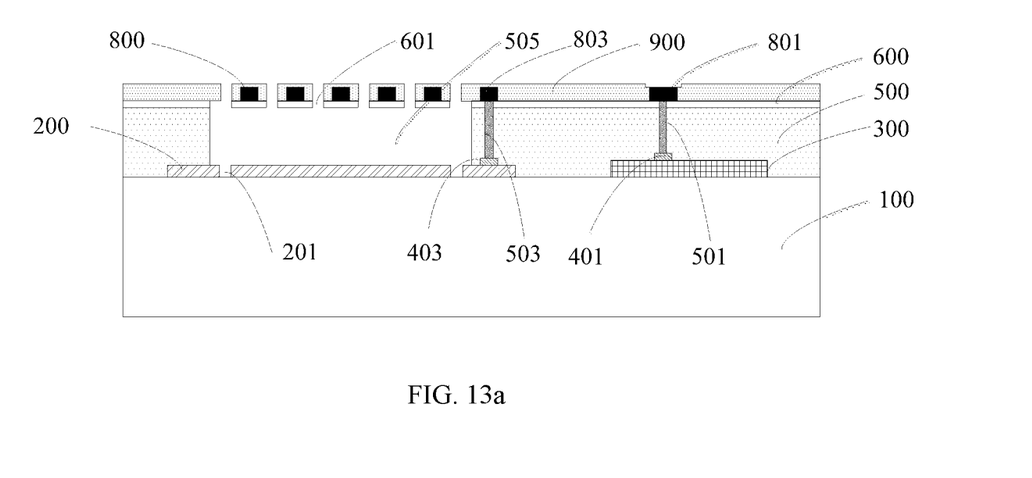
Figure 13B:
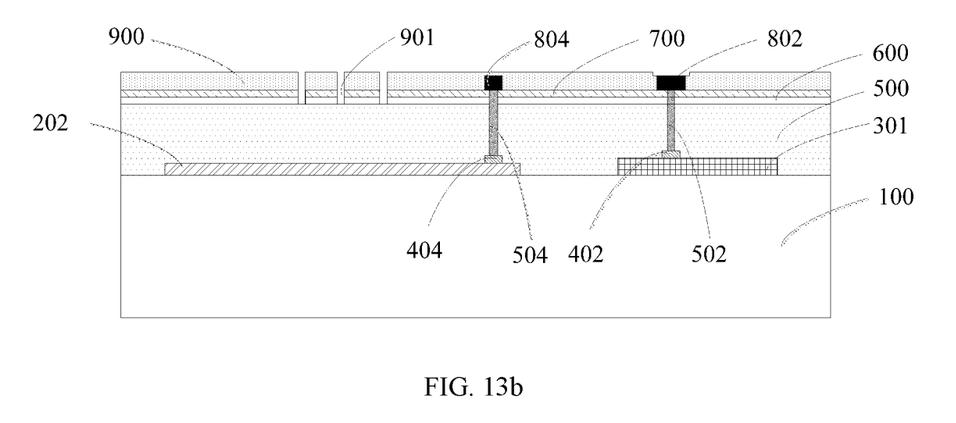

S110: The second through holes 901 in the passivation layer 900 are deeply etched down to the sacrificial layer 500, as shown in FIGS. 12a and 13b. Portions of the insulating layer 600 and the upper electrode 700 corresponding to the second through holes 901 may be deeply etched by ICP until the sacrificial layer is exposed from the second through holes 901 so as to further etch the sacrificial layer 500 to form a closed space 506 of the vibration space 505.

Figure 14B:
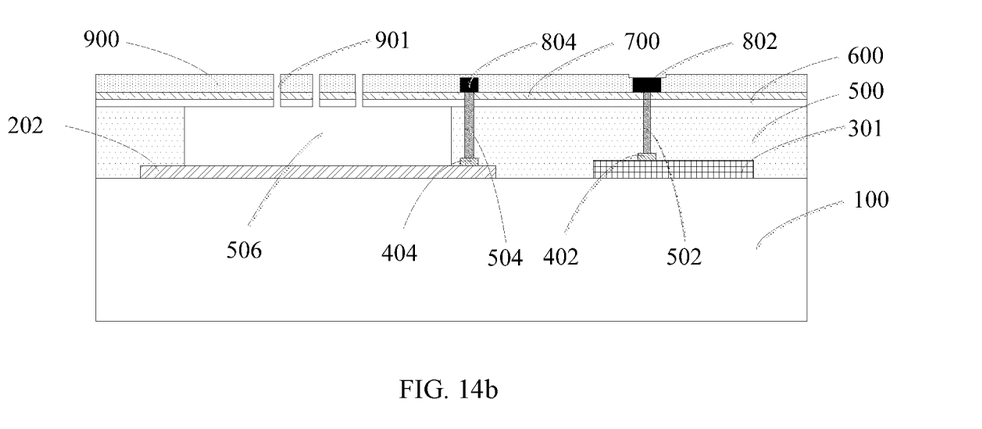

S111, A portion of the sacrificial layer 500 between the upper electrode 700 and the lower electrode 202 is etched away and sealed to form a closed space 506, as shown in FIG. 14b. For example, the sacrificial layer 500 may be etched by injecting an etching solution into the second through holes 901, and a hollow region is formed between the upper electrode 700 and the lower electrode 202, and a passivation material such as SiN, etc. is deposited in the second through holes 901 to seal the closed space 506 of the air pressure sensor, and finally the air pressure sensor and the second integrated circuit 301 are formed, as shown in FIG. 2b.

S112: A portion of the sacrificial layer 500 between the vibrating membrane 200 and the back electrode 800 is etched to form a vibration space 505 which is in communication with the exterior of the integrated structure, as shown in FIG. 13a. For example, the sacrificial layer 500 may be etched by injecting an etching solution into the second through holes 901 corresponding to the back electrode 800 to form a hollow region between the back electrode 800 and the vibrating membrane 200 so that the vibrating membrane 200 and the back electrode 800 form a capacitor.

S113: A back cavity 101 is formed by etching off a region of the base substrate 100 corresponding to the vibrating membrane 200, and finally a microphone and a first integrated circuit 300 structure as shown in FIG. 2a are formed. The portion of the base substrate 100 corresponding to the membrane 200 is etched to form the back cavity 101 and the vibrating membrane 200 is suspended on the base substrate 100, so that the vibrating membrane 200 can vibrate under the action of the air flow.

It is to be noted that the selection of the fabrication process and materials is not limited to those set forth in this embodiment, and other conventional alternative processes and materials in which the present invention may be implemented are also within the scope of the present invention.

Obviously, the above-described embodiments of the present invention are merely illustrative of the present invention, and are not intended to limit the embodiments of the present invention. Those skilled in the art, based on the above description, will be able to make other variations or alterations, which are not intended to be exhaustive of all the embodiments, and the obvious variations or alterations which may arise from the technical solutions of the present invention still fall within the scope of the present invention.

The invention claimed is:

1. An integrated structure of a MEMS microphone and an air pressure sensor, comprising:
   a base substrate;
   a vibrating membrane, a back electrode, an upper electrode, a lower electrode formed on the base substrate, and a sacrificial layer formed between the vibrating membrane and the back electrode and between the upper electrode and the lower electrode;
   a first integrated circuit electrically connected to the vibrating membrane and the back electrode, respectively; and
   a second integrated circuit electrically connected to the lower electrode and the upper electrode, respectively,
   wherein a back cavity is formed adjacent to the vibrating membrane in a region of the base substrate corresponding to the vibrating membrane, the sacrificial layer between the vibrating membrane and the back electrode is hollowed out to form a vibration space which is in communication with an exterior of the integrated structure, and the sacrificial layer between the upper electrode and the lower electrode is hollowed out to form a closed space.

2. The integrated structure according to claim 1, wherein the first integrated circuit and the second integrated circuit are disposed on the base substrate,
   a first metal layer is formed on the first integrated circuit, and a second metal layer is formed on the second integrated circuit, a first lead-out electrode electrically connected to the first metal layer through a first via and a second lead-out electrode electrically connected to the second metal layer through a second via are further formed on the sacrificial layer, and the first lead-out electrode is further connected to the back electrode, and the second lead-out electrode is further connected to the upper electrode.

3. The integrated structure according to claim 2, wherein a third metal layer is formed on the vibrating membrane, and a fourth metal layer is formed on the lower electrode, the third metal layer is connected to the first metal layer through a first metal trace formed on the base substrate, and the fourth metal layer is connected to the second metal layer through a second metal trace formed on the base substrate, and a third lead-out electrode electrically connected to the third metal layer through a third via and a fourth lead-out electrode electrically connected to the fourth metal layer through a fourth via are formed on the sacrificial layer, the third lead-out electrode is electrically connected to the first lead-out electrode and the fourth lead-out electrode is electrically connected to the second lead-out electrode.

4. The integrated structure according to claim 2, wherein a passivation layer is further formed on the first lead-out electrode and the second lead-out electrode, and at least portions of the first lead-out electrode and the second lead-out electrode are exposed through the passivation layer.

5. The integrated structure according to claim 1, wherein an insulating layer is further formed between the sacrificial layer and the upper electrode and between the sacrificial layer and the back electrode, and third through holes for communicating the vibration space with the exterior of the integrated structure is formed in a region of the insulating layer corresponding to the vibration space.

6. A method of fabricating an integrated structure of a MEMS microphone and an air pressure sensor, comprising:
forming a vibrating membrane, a lower electrode, a first integrated circuit, and a second integrated circuit on a base substrate by a patterning process;
forming a sacrificial layer;
forming an upper electrode and a back electrode on the sacrificial layer by a patterning process, wherein the first integrated circuit is electrically connected to the vibrating membrane and the back electrode, respectively, and the second integrated circuit is electrically connected to the lower electrode and the upper electrode, respectively;
etching the sacrificial layer between the upper electrode and the lower electrode and sealing to form a closed space;
etching the sacrificial layer between the vibrating membrane and the back electrode to form a vibration space which is communicated with an exterior of the integrated structure; and
etching a region of the base substrate corresponding to the vibrating membrane to form a back cavity.

7. The method according to claim 6, further comprising:
prior to depositing the sacrificial layer, depositing a metal on the first integrated circuit and the second integrated circuit and patterning the metal to form a first metal layer and a second metal layer;
after depositing the sacrificial layer, further forming a first via and a second via on the sacrificial layer and metallizing the first via and the second via so as to be connected to the first metal layer and the second metal layer, respectively; and
depositing a metal on an upper surface of the sacrificial layer and patterning the metal to form a first lead-out electrode connected to the first via and a second lead-out electrode connected to the second via, while connecting the first lead-out electrode and the back electrode and connecting the second lead-out electrode and the upper electrode by the patterning.

8. The method of claim 7, further comprising:
prior to depositing the sacrificial layer, depositing a metal on the vibrating membrane and patterning the metal to form a third metal layer, and depositing a metal on the lower electrode and patterning the metal to form a fourth metal layer;
forming a first metal trace connecting the third metal layer and the first metal layer on the base substrate, and forming a second metal trace connecting the fourth metal layer and the second metal layer on the base substrate; and
forming a third via and a fourth via on the sacrificial layer and metallizing the third via and the fourth via so as to be electrically connected to the third metal layer and the fourth metal layer, respectively, and further forming a third lead-out electrode connected to the third via and a fourth lead-out electrode connected to the fourth via on the upper surface of the sacrificial layer.

9. The method according to claim 7, further comprising:
forming a passivation layer on the first lead-out electrode and the second lead-out electrode; and
etching the passivation layer so that at least portions of the first lead-out electrode and the second lead-out electrode are exposed through the passivation layer.

10. The method according to claim 6, wherein the etching the sacrificial layer between the upper electrode and the lower electrode and sealing to form a closed space specifically comprises:
etching the upper electrode to form at least one second through hole communicated with the sacrificial layer, etching the sacrificial layer exposed, and sealing the second through hole to form the closed space.

* * * * *